United States Patent
Kappel

(10) Patent No.: US 8,803,551 B2
(45) Date of Patent: Aug. 12, 2014

(54) LOW SUPPLY VOLTAGE LOGIC CIRCUIT

(75) Inventor: Robert Kappel, Graz (AT)

(73) Assignee: Infineon Technologies Austria AG, Villach (AT)

( * ) Notice: Subject to any disclaimer, the term of this patent is extended or adjusted under 35 U.S.C. 154(b) by 16 days.

(21) Appl. No.: 13/562,036

(22) Filed: Jul. 30, 2012

(65) Prior Publication Data

US 2014/0028346 A1    Jan. 30, 2014

(51) Int. Cl.
*H03K 17/16*    (2006.01)
*H03K 19/003*    (2006.01)
*H03K 3/00*    (2006.01)
*H05B 1/00*    (2006.01)

(52) U.S. Cl.
USPC ............................................. 326/34; 327/108

(58) Field of Classification Search
USPC ................. 326/34, 31; 327/108, 109
See application file for complete search history.

(56) References Cited

U.S. PATENT DOCUMENTS

| | | | |
|---|---|---|---|
| 4,918,336 A * | 4/1990 | Graham et al. | 326/117 |
| 6,157,259 A | 12/2000 | Dasgupta | |
| 6,535,021 B1 | 3/2003 | Song | |
| 7,429,874 B2 | 9/2008 | Byun et al. | |
| 7,868,606 B2 | 1/2011 | Metereliyoz et al. | |
| 7,948,268 B2 * | 5/2011 | Rosen et al. | 326/38 |
| 2003/0011408 A1 * | 1/2003 | Tsuchi | 327/108 |
| 2003/0080774 A1 * | 5/2003 | Funaba | 326/30 |
| 2004/0232991 A1 | 11/2004 | Zhou et al. | |
| 2010/0321094 A1 | 12/2010 | Luo et al. | |
| 2012/0182070 A1 * | 7/2012 | Soussan et al. | 330/253 |

* cited by examiner

*Primary Examiner* — Alexander H Taningco
*Assistant Examiner* — Dylan White
(74) *Attorney, Agent, or Firm* — Slater & Matsil, L.L.P.

(57) ABSTRACT

A low supply voltage logic circuit includes a first current source operable to generate a first current dependent on a first control signal and to generate a first leakage current. A second current source is operable to generate a second current dependent on a second control signal and to generate a second leakage current. A third current source has a third current path between the output terminal and the first supply voltage terminal and is operable to generate a third current through the third current path to compensate for the second leakage current. A fourth current source has a fourth current path between the output terminal and the second supply voltage terminal and is operable to generate a fourth current through the fourth current path to compensate for the first leakage current.

18 Claims, 3 Drawing Sheets

LOW SUPPLY VOLTAGE LOGIC CIRCUIT

TECHNICAL FIELD

Disclosed herein is a low supply voltage circuit and, in particular, a low supply voltage logic circuit.

BACKGROUND

Energy harvesting, also known as power harvesting or energy scavenging, is the process by which energy is derived from external sources (e.g., solar power, thermal energy, wind energy, salinity gradients, and kinetic energy), captured, and stored for small, wireless autonomous devices, like those used in wearable electronics and wireless sensor networks. Energy harvesters convert ambient energy into electrical energy and provide a very small amount of power for low-energy electronics. Thus, the power consumption of the electronics needs to be as low as possible. A common way of decreasing the power consumption of electronics, in particular digital, i.e., logic circuitry such as all kinds of gates and inverters, is to decrease the supply voltage. The minimum supply voltage of a logic circuit is dependent on various manufacturing process parameters. The trigger levels of logic circuits are dependent on the (minimum) supply voltage and also on the manufacturing process parameters, meaning that the reliability of logic circuits at lower supply voltages is low or that power consumption is high when the supply voltage is increased in order to increase the reliability of the logic circuit. Thus, there is a need for reliable logic circuits at low voltages.

SUMMARY OF THE INVENTION

A low supply voltage logic circuit comprises a first current source that has a first control input for receiving a first control signal and a first current path between an output terminal and a first supply voltage terminal; the first current source being operable to generate a first current through the first current path dependent on the first control signal and to generate a first leakage current; a second current source that has a second control input for receiving a second control signal and a second current path between an output terminal and a second supply voltage terminal; the second current source being operable to generate a second current through the second current path dependent on the second control signal and to generate a second leakage current; a third current source that has a third current path between the output terminal and the first supply voltage terminal and that is operable to generate a third current through the third current path to compensate for the second leakage current; and a fourth current source that has a fourth current path between the output terminal and the second supply voltage terminal and that is operable to generate a fourth current through the fourth current path to compensate for the first leakage current. The first control signal and the second control signal correspond to an input voltage so that the first current source and the second current source are controlled inversely.

BRIEF DESCRIPTION OF THE DRAWINGS

Various specific embodiments are described in more detail below based on the exemplary embodiments shown in the figures of the drawings. Unless stated otherwise, similar or identical components are labeled in all of the figures with the same reference numbers.

DETAILED DESCRIPTION OF ILLUSTRATIVE EMBODIMENTS

Figure 1:
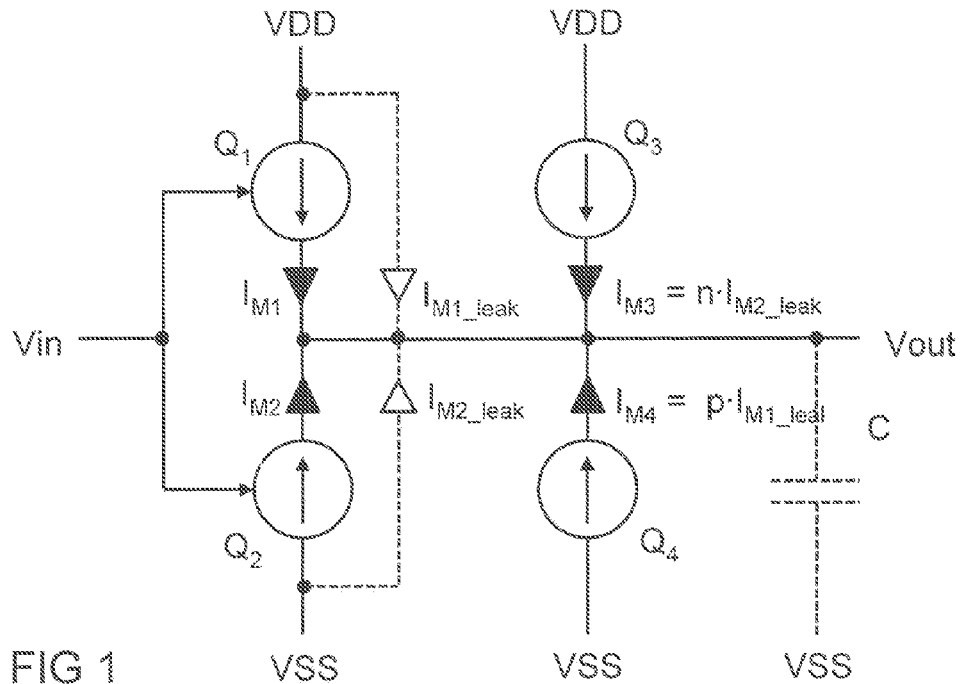
FIG. 1 is a circuit diagram of an exemplary logic circuit with leak current compensation.

An improved sub-threshold logic circuit, which may be, for instance, an inverter as shown in the circuit diagram of FIG. 1, forms a basic low-voltage digital logic cell which can be adapted in different ways to create all other types of logic cells such as gates (e.g., AND, NAND, OR, NOR, XAND, XOR gates), oscillators (e.g., ring oscillators, RC feedback oscillators), delays (runtime delays, RC delays), comparators and the like. The sub-threshold inverter of FIG. 1 includes two controllable current sources, first current source $Q_1$ and second current source $Q_2$, which form a common inverter circuit. Current source $Q_1$ has a first controlled current path which is connected between a first supply line for an, e.g., positive, supply potential VDD and an output line for an output signal Vout of the inverter. The output signal Vout drives a load, e.g., a capacitance C which may be established by the capacitance of the output line. Current source $Q_2$ has a second controlled current path which is connected between the output line for the output signal Vout and a second supply line for an, e.g., negative, supply potential VSS. Current sources $Q_1$ and $Q_2$ are inversely controlled by a first control signal and a second control signal so that the current of current source $Q_2$ decreases when the current of the current source $Q_1$ increases, and vice versa.

The first control signal which is supplied to a control input of current source $Q_1$ and the second control signal which is supplied to a control input of current source $Q_2$ correspond to an input signal Vin present on an input line, so that the first current source $Q_1$ and the second current source $Q_2$ are controlled inversely. For instance, if the current sources $Q_1$ and $Q_2$ are identical, the first control signal may correspond non-inversely and the second control signal may correspond inversely to the input signal Vin, or vice versa. Alternatively, the current sources $Q_1$ and $Q_2$ may be of inverse types and the first control signal and the second control signal may correspond in an identical manner to the input signal Vin. In the inverter of FIG. 1, the first control signal and the second control signal are, for instance, the input signal Vin. The current source $Q_1$ provides a current $I_{M1}$ that is controllable by the input signal Vin, and a leakage current $I_{M1\_leak}$ that acts in the manner of a bypass of the current source $Q_1$. The current source $Q_2$ provides a current $I_{M2}$ that is inverse to the current $I_{M1}$ and that is controllable by the input signal Vin, and a leakage current $I_{M2\_leak}$ that acts in the manner of a bypass of the current source $Q_2$.

The switching threshold of a sub-threshold inverter is ideally (VDD+VSS)/2, which means that the switching threshold of a sub-threshold inverter is dependent on the supply voltage VDD−VSS. Moreover, the switching threshold is dependent on various manufacturing process related parameters whose strong variations can lead to variations of the switching threshold of up to ±50% and more. It has been found that the manufacturing process related parameters mainly affect the leakage currents $I_{M1\_leak}$ and $I_{M2\_leak}$. The improved sub-threshold inverter includes a compensating circuit for compensating for the leakage currents $I_{M1\_leak}$ and $I_{M2\_leak}$. The compensating circuit includes a third current source $Q_3$ having a third current path that is connected between the supply line for the first supply potential VDD and the output line for the output signal Vout and a fourth current source $Q_4$ having a fourth current path that is connected between the output line for the output signal Vout and the supply line for the second supply potential VSS. A current $I_{M3}$ through the third current path may be a multiple n of the second leakage current $I_{M2\_leak}$ and a current $I_{M4}$ through the fourth current path may be a multiple p of the first leakage current $I_{M1\_leak}$ through the first current path.

Figure 2:
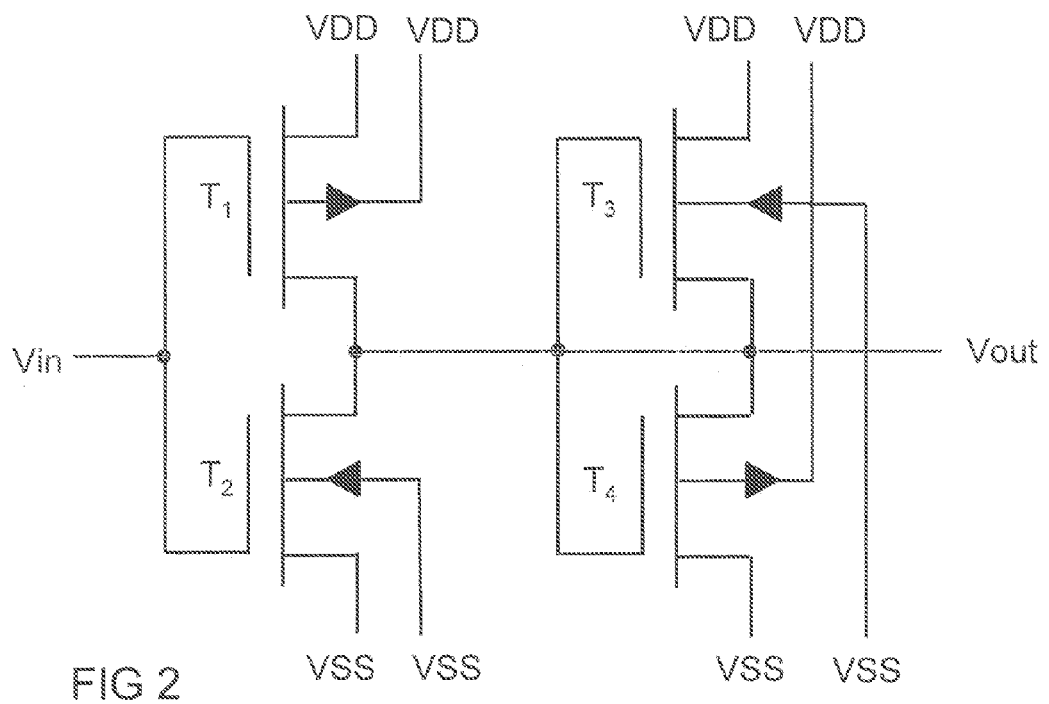
FIG. 2 is a circuit diagram of another exemplary logic circuit with leakage current compensation.

Another exemplary sub-threshold complementary metal oxide semiconductor (CMOS) inverter is shown in FIG. 2, which includes four metal oxide semiconductor field-effect transistors (MOSFET) $T_1$, $T_2$, $T_3$, $T_4$ having source, drain, gate and body (bulk) lines; two of which being n-channel metal oxide semiconductor (NMOS) transistors $T_2$, $T_3$ and two being p-channel metal oxide semiconductor (PMOS) transistors $T_1$, $T_4$. PMOS transistor $T_1$ is operated as a controllable current source such as the current source $Q_1$ of the inverter shown in FIG. 1. PMOS transistor $T_1$ has its source line connected to the supply line for the supply potential VDD, its drain line connected to the output line for the output signal Vout, its gate line connected to the input line for the input signal Vin, and its body connected to the supply line for the supply potential VDD. NMOS transistor $T_2$ is operated as a controllable current source such as the current source $Q_2$ of the inverter shown in FIG. 1.

NMOS transistor $T_2$ has its source line connected to the supply line for the supply potential VSS, its drain line connected to the output line for the output signal Vout, its gate line connected to the input line for the input signal Vin, and its body line connected to the supply line for the supply potential VSS. NMOS transistor $T_3$ is operated as a current source such as the current source $Q_3$ of the inverter shown in FIG. 1. NMOS transistor $T_3$ has its drain line connected to the supply line for the supply potential VDD, its source line connected to the output line for the output signal Vout, its gate line connected to the output line for the input signal Vout, and its body line connected to the supply line for the supply potential VSS. PMOS transistor $T_4$ has its drain line connected to the supply line for the supply potential VSS, its source line connected to the output line for the output signal Vout, its gate line connected to the output line for the output signal Vout, and its body line connected to the supply line for the supply potential VDD. Transistors $T_1$ and $T_4$ as well as $T_2$ and $T_1$ are matched for compensation. Alternatively, the body lines of transistors T3 and T4 may be connected to the output line for output voltage Vout.

Figure 3:
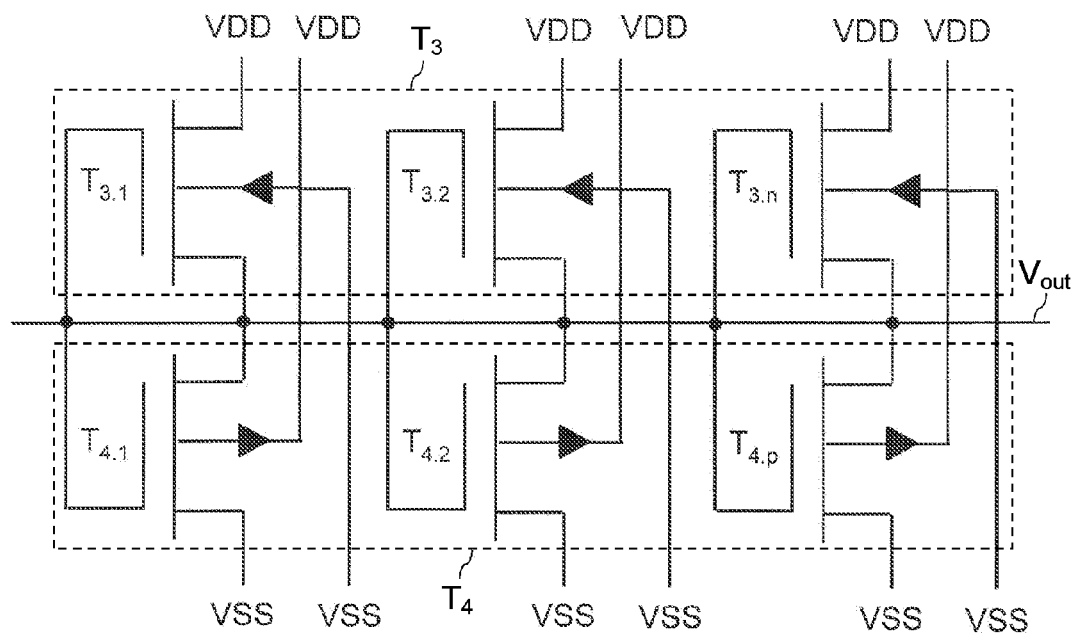
FIG. 3 is a circuit diagram of another exemplary leakage current compensation for use with the logic circuit of FIG. 2.

Referring now to FIG. 3, in order to adjust the currents $I_{M1}$ and $I_{M2}$ so that $I_{M3}=n \cdot I_{M2}$ and $I_{M4}=p \cdot I_{M1}$ as described above in connection with FIG. 2, a multiplicity of identical or similar transistors, e.g., of a transistor array, may be connected in parallel to form the transistors $T_3$ and $T_4$ in the circuit of FIG. 2. For instance, transistor $T_3$ of FIG. 2 may include n NMOS transistors $T_{3.1}$, $T_{3.2}$ ... $T_{3.n}$ and transistor $T_4$ may include p PMOS transistors $T_{4.1}$, $T_{4.2}$ ... $T_{4.p}$. In the present example, n=p=3, but n and p could be any numbers in which n, p≥1 with n=p and n≠p.

The circuit shown in FIG. 2 (in which the transistors 3 and 4 may be substituted by transistor arrays as shown in FIG. 3) can be described as follows, whereby it is assumed that potential VSS is ground, i.e., VSS=0, and all transistors $T_1$, $T_2$, $T_3$, $T_4$ are identical:

$$I_{M1} = \frac{W}{L} I_{tp} e^{\frac{VDD-Vin-Vtp}{\alpha \phi_t}} \left[1 - e^{-\frac{VDD-Vout}{\phi_t}}\right] \qquad (1)$$

$$I_{M2} = \frac{W}{L} I_{tn} e^{\frac{Vin-Vtn}{\alpha \phi_t}} \left[1 - e^{-\frac{Vout}{\phi_t}}\right] \qquad (2)$$

$$I_{M3} = n \frac{W}{L} I_{tn} e^{\frac{-Vtn}{\alpha \phi_t}} \left[1 - e^{-\frac{VDD-Vout}{\phi_t}}\right] \qquad (3)$$

$$I_{M4} = p \frac{W}{L} I_{tp} e^{\frac{-Vtp}{\alpha \phi_t}} \left[1 - e^{-\frac{Vout}{\phi_t}}\right] \qquad (4)$$

wherein W is the width of the transistor channel or, in case of a transistor array, the sum of the channel widths of all array transistors; L is the length of the transistor channel or, in case of a transistor array, the sum of the channel lengths of all array transistors; Vtp, Vtn are threshold voltages of the transistors; and $I_{tp}$, $I_{tn}$, and α represent process related parameters and $\Phi_t$ represents a temperature related parameter.

At the switching threshold VDD–VSS/2 with VSS=0, the sum of currents $I_{M1}$ and $I_{M3}$ is equal to the sum of the currents $I_{M2}$ and $I_{M4}$, i.e., $I_{M1}+I_{M3}=I_{M2}+I_{M4}$. Thus, summing up all currents $I_{M1}$ ... $I_{M4}$ leads to:

$$I_{M1} + I_{M3} = I_{M2} + I_{M4} \qquad (5)$$

$$I_{tp} e^{-\frac{Vtp}{\alpha \phi_t}} \left(p - e^{-\frac{VDD-Vin}{\alpha \phi_t}}\right) = I_{tn} e^{-\frac{Vtn}{\alpha \phi_t}} \left(n - e^{\frac{Vin}{\alpha \phi_t}}\right) \qquad (6)$$

in which the process dependant parameters $I_{tp}$, $I_{tn}$ and α, and the temperature related parameter $\Phi_t$ are multiplied with a factor that is independent of the manufacturing process. Thus, n and p are adjusted so that, at the threshold of VDD(–VSS)/2, the terms in brackets compensate for the manufacturing process parameters. For instance, p and n may be 3 ... 4 for a supply voltage VDD(–VSS) of 70 mV at a temperature of 300K $$n_{ideal} = p_{ideal} = e^{\frac{VDD}{2\alpha \phi_t}} \qquad (7)$$

Leakage current compensation will now be explained in more detail with regard to transistors $T_2$ and $T_3$. Rearranging equation (2) gives equation (8) in which the term in brackets represents the leakage current $I_{leak}$ of transistor $T_2$ and the term outside the brackets represents a control factor $$c = e^{\frac{Vin}{\alpha \phi t}}.$$

$$I_{M2} = e^{\frac{Vin}{\alpha \phi t}} \cdot \left(\frac{W}{L} I_{tn} e^{\frac{-Vtn}{\alpha \phi_t}}\right), \qquad (8)$$

so that $$I_{M2} = e^{\frac{Vin}{\alpha \phi t}} \cdot I_{leak}. \qquad (9)$$

Due to variations in the manufacturing process leakage current $I_{leak}$ may change from device to device as can be seen from equation (10), i.e., an additional leakage current $\Delta I_{leak}$ may add to $I_{leak}$, as set forth in equation (11).

$$I_{M2} = e^{\frac{Vin}{\alpha \phi_t}} \cdot \left( \frac{W}{L} I_m e^{\frac{-Vtn}{\alpha \phi_t}} \right) \quad (10)$$

As can be further seen from equation (10), the additional leakage current $\Delta I_{leak}$ is also controlled by the control factor c and, thus, by the input voltage Vin. Therefore, the impact $\Delta I_{M2}$ of the additional leakage current $\Delta I_{leak}$ on the current $I_{M2}$ is:

$$\Delta I_{M2} = e^{\frac{Vin}{\alpha \phi_t}} \cdot (\Delta I_{leak}) \quad (11)$$

The compensation current through transistor $T_3$ ($T_4$) is n-times (p-times) the additional leakage current $\Delta I_{leak}$ of transistor $T_2$ ($T_1$). To realize this factor n (p) in the compensating current source $Q_3$ ($Q_4$), a multiplicity of n NMOS transistors $T_{3.1}$, $T_{3.2}$ ... $T_{3.n}$ (in current source $Q_4$, p PMOS transistors $T_{4.1}$, $T_{4.2}$ ... $T_{4.p}$) that are similar or identical to transistor $T_2$ and whose source and gate lines are connected with each other, may be used instead of a single transistor such as transistor $T_3$. The compensating current $I_{M3}$ provided by current source Q3 is thus:

$$I_{M3} = n \cdot \frac{W}{L} I_m e^{\frac{-Vtn}{\alpha \phi_t}} = n \cdot I_{leak} \quad (12)$$

Therefore, the leakage current of each one of the multiplicity n of transistors $T_{4.1}$, $T_{4.2}$ ... $T_{4.p}$ varies due to manufacturing process variations in a similar or same manner as the leakage current $I_{leak}$ of transistor T2:

$$I_{M2} = n \cdot (I_{leak} + \Delta I_{leak}) \quad (13)$$

so that $$\Delta I_{M3} = n \cdot (\Delta I_{leak}). \quad (14)$$

For compensation of the additional leakage currents, i.e., $\Delta I_{M3} = \Delta I_{M2}$ the following applies:

$$n = e^{\frac{Vin}{\alpha \phi_t}} \quad (15)$$

Figure 4:
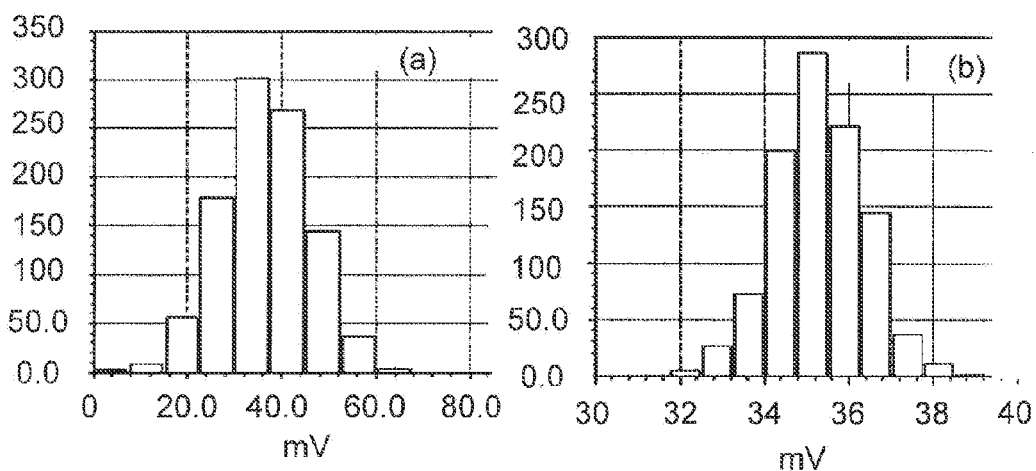
FIG. 4 is a comparative diagram illustrating the thresholds of inverters with and without leakage current compensation.

In FIG. 4, two diagrams depict as frequencies of occurrence (counts) over threshold voltage [mV] simulation results for (a) an inverter without compensation and (b) an inverter with compensation. The simulations, in the present case Monte-Carlo simulations, were conducted on the basis of several process variations and mismatches (1000 runs) with a supply voltage VDD−VSS of 70 mV and a switching threshold of VDD−VSS/2. It is apparent from FIG. 4 that the inverter without compensation has according to diagram (4a) a threshold of 36 mV±56 mV, while the inverter with compensation has according to diagram (4b) a threshold of 35 mV±3.6 mV.

Figure 5:
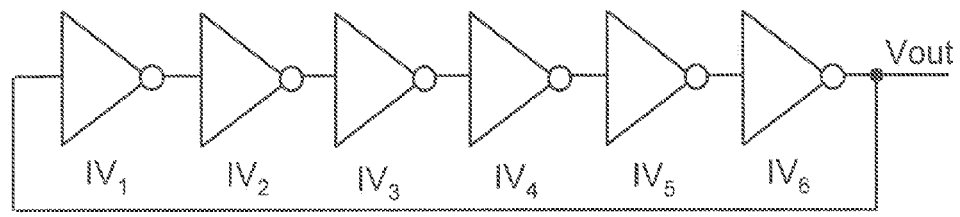
FIG. 5 is a circuit diagram of an oscillator circuit that comprises a multiplicity of improved logic circuits.

Referring to FIG. 5, k logic circuits, (k=5 in the present example) as described above in connection with FIGS. 1-3 may be used as inverters which are connected in series, thereby forming a delay line. The delay line's output is fed back to its input so that an oscillating circuit structure is established. Such oscillating structure may be used in, e.g., clock oscillators for digital circuits.

Figure 6:
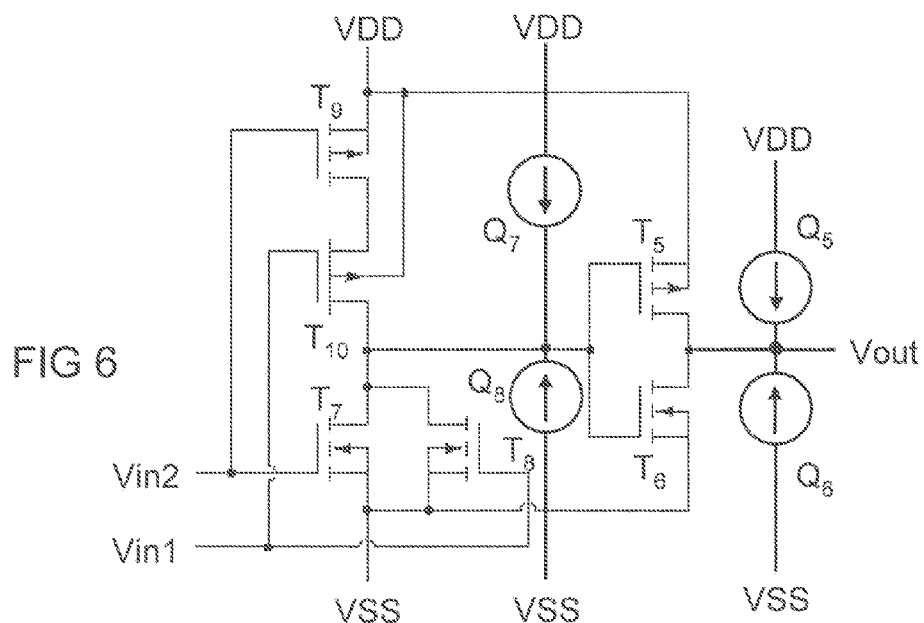
FIG. 6 is a circuit diagram of an OR gate based on an improved logic circuit.

Another application of improved logic circuits is shown in FIG. 6 which is a circuit diagram of an improved low supply voltage low supply voltage OR gate. The OR gate has an output stage that is supplied with supply potentials VDD and VSS and that includes an inverter of the type described above in connection with FIGS. 1-3. The inverter includes an NMOS transistor $T_5$ and a PMOS transistor $T_6$ that may be connected in a like or similar manner to transistors $T_1$ and $T_2$ in the logic circuit of FIG. 2. The output stage includes also a compensation circuit which may have two current sources $Q_5$ and $Q_6$ for leak current compensation, both connected in a like or similar manner to current sources $Q_3$ and $Q_4$ in the logic circuit of FIG. 1. Thus, the output line of the OR gate, which provides the output signal Vout, is connected to the source lines of transistors $T_5$ and $T_6$ whose drain lines are connected to supply potentials VDD and VSS. Furthermore, the output line is connected through current source $Q_5$ to supply potential VDD and through source $Q_6$ to supply potential VSS. The currents of sources $Q_5$ and $Q_6$ are adjusted to compensate for the leakage currents of transistors $T_5$ and $T_6$.

An input stage is connected upstream of the output stage and includes two NMOS field-effect transistors $T_7$ and $T_8$ and two PMOS field-effect transistors $T_9$ and $T_{10}$. The source and body lines of transistors $T_7$ and $T_8$ are connected to supply potential VSS. The drain lines of transistors $T_7$ and $T_8$ are connected to the gate lines of transistors $T_5$ and $T_6$, and to the drain line of transistor $T_{10}$ whose body line is connected to supply potential VDD and whose source line is connected to the drain line of transistor $T_9$. The gate line of transistor $T_9$, whose source and body lines are connected to supply potential VDD, and the gate line of transistor $T_7$ are connected to a first input line for a first input voltage Vin1. The gate line of transistor $T_{10}$ and the gate line of transistor $T_8$ are connected to a second input line for a second input voltage Vin2. The leakage currents occurring in the input stage are compensated by way of two current sources $Q_7$ and $Q_9$. The current source $Q_7$ is connected between the supply potential VDD and the input line of the output stage, and is adapted to compensate for the leakage currents of transistors $T_7$ and $T_8$. The current source $Q_8$ is connected between the supply potential VSS and the input line of the output stage, and is adapted to compensate for the leakage currents of transistors $T_9$ and $T_{10}$.

Figure 7:
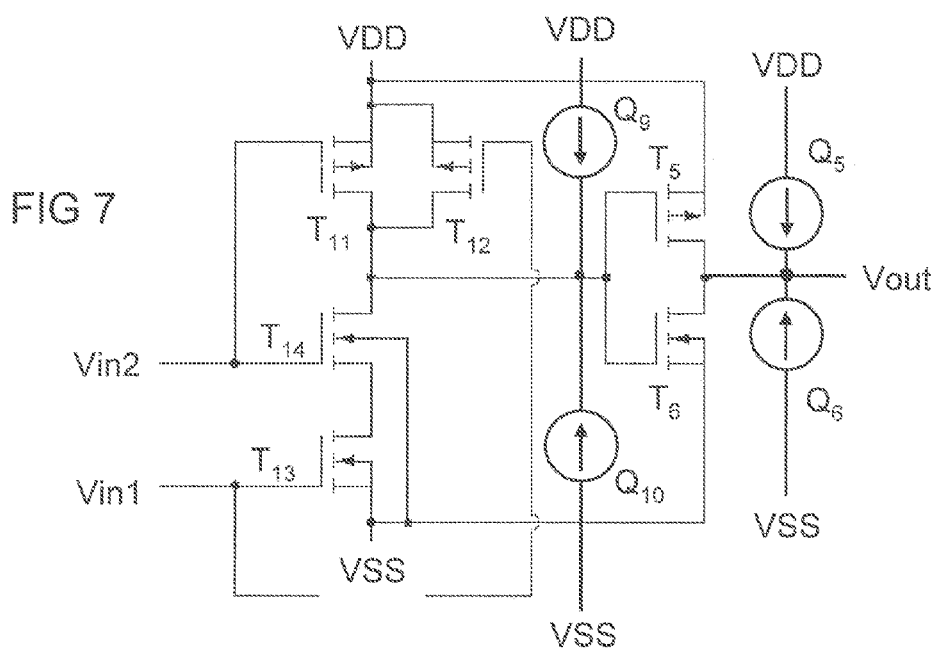
FIG. 7 is a circuit diagram of an AND gate based on an improved logic circuit.

Another application of improved logic circuits is shown in FIG. 7 which is a circuit diagram of an improved low supply voltage AND gate. The AND gate has an output stage that may be the same as the one used in the circuit of FIG. 6. An input stage is connected upstream of the output stage and includes two PMOS field-effect transistors $T_{11}$ and $T_{12}$ and two NMOS field-effect transistors $T_{13}$ and $T_{14}$. The source and body lines of transistors $T_{11}$ and $T_{12}$ are connected to supply potential VDD. The drain lines of transistors $T_{11}$ and $T_{12}$ are connected to the gate lines of transistors $T_5$ and $T_6$, and to the drain line of transistor $T_{14}$ whose body line is connected to supply potential VSS and whose source line is connected to the drain line of transistor $T_{13}$. The gate line of transistor $T_{13}$, whose source and body lines are connected to supply potential VSS, and the gate line of transistor $T_{12}$ is connected to a first input line for a first input voltage Vin1. The gate line of transistor $T_{14}$ and the gate line of transistor $T_{11}$ are connected to a second input line for a second input voltage Vin2. The leakage currents occurring in the input stage are compensated by two current sources $Q_9$ and $Q_{10}$. The current source $Q_9$ is connected between the supply potential VDD and the input line of the output stage, and is adapted to compensate for the leakage currents of transistors $T_{13}$ and $T_{14}$. The current source $Q_{10}$ is connected between the supply potential VSS and the input line of the output stage, and is adapted to compensate for the leakage currents of transistors $T_{11}$ and $T_{12}$.

Although the present invention and its advantages have been described in detail, it should be understood that various changes, substitutions, and alterations can be made herein without departing from the spirit and scope of the invention as defined by the appended claims. For example, it will be readily understood by those skilled in the art that the voltages and polarities may be altered while remaining within the scope of the present invention.

What is claimed is:

1. A low supply voltage logic circuit comprising:
   a first current source that has a first control input applied to receive a first control signal and a first current path between an output terminal and a first supply voltage terminal, the first current source being operable to generate a first current through the first current path dependent on the first control signal and a first leakage current;
   a second current source that has a second control input coupled to receive a second control signal and a second current path between the output terminal and a second supply voltage terminal, the second current source being operable to generate a second current through the second current path dependent on the second control signal and a second leakage current, wherein the first control signal and the second control signal correspond to an input voltage so that the first current source and the second current source are controlled inversely;
   a third current source that has a third current path between the output terminal and the first supply voltage terminal, the third current source operable to generate a third current through the third current path to compensate for the second leakage current;
   a fourth current source that has a fourth current path between the output terminal and the second supply voltage terminal, the fourth current source operable to generate a fourth current through the fourth current path to compensate for the first leakage current; and
   wherein a sum of the first current and the third current substantially equals a sum of the second current and the fourth current when the first control signal is operated at a switching threshold.

2. The circuit of claim 1, wherein the first current source, the second current source, the third current source and the fourth current source each comprise each a field-effect transistor that has a gate terminal and a source-drain path between a source terminal and a drain terminal, and wherein the gate forms the control input and the source-drain path forms the current path.

3. The circuit of claim 2, wherein the field-effect transistor of the first current source and the field-effect transistor of the fourth current source are of a first conductivity type and the field-effect transistor of the second current source and the field-effect transistor of the third current source are of a second conductivity type.

4. The circuit of claim 3, wherein:
   the gate terminals of the field-effect transistors of the first current source and second current source are coupled with each other to form an input that is coupled to receive the input voltage; and
   the gate terminals of the field-effect transistors of the third current source and fourth current source are coupled with the output terminal.

5. The circuit of claim 2, wherein the field-effect transistor of the first current source and the field-effect transistor of the fourth current source are matched and the field-effect transistor of the second current source and the field-effect transistor of the third current source are matched.

6. The circuit of claim 1, wherein current through the third current path is a multiple n of the second leakage current and current through the fourth current path is a multiple p of the first leakage current.

7. The circuit of claim 6, wherein the third current source comprises a plurality n of field-effect transistors and the fourth current source comprises a plurality p of field-effect transistors that have a gate terminal and a source-drain path between a source terminal and a drain terminal, and wherein the gates form the control inputs and the source-drain path forms the current path.

8. The circuit of claim 7, wherein the first current source comprises a first field-effect transistor, the second current source comprises a second field-effect transistor, the n field-effect transistors of the third current source are the same size as the second transistor, and the p field-effect transistors of the fourth current source are the same size as the first transistor.

9. The circuit of claim 6, wherein p and n are dependent on the input voltage.

10. The circuit of claim 6, wherein p and n are dependent on manufacturing process parameters.

11. A method of operating a circuit, wherein the method comprises:
    generating a first current through a first current path of a first current source coupled between an output terminal and a first supply voltage terminal, wherein the first current is dependent on an input voltage and a first leakage current;
    generating a second current through a second current path of a second current source coupled between the output terminal and a second supply voltage terminal, wherein the second current is dependent on the input voltage and a second leakage current, wherein the input voltage affects the first current source and the second current source inversely;
    generating a third current through a third current path of a third current source coupled between the output terminal and the first supply voltage terminal, wherein the third current compensates for the second leakage current; and
    generating a fourth current through a fourth current path of a fourth current source coupled between the output terminal and the second supply voltage terminal, wherein the fourth current compensates for the first leakage current, wherein a sum of the first current and the third current substantially equals a sum of the second current and the fourth current when the input voltage is operated at a switching threshold.

12. A circuit comprising:
    a first transistor of a first device type having a first control terminal coupled to an input voltage node, a first terminal coupled to an output node, and a second terminal coupled to a first supply voltage;
    a second transistor of a second device type opposite the first device type having a second control terminal coupled to the input voltage node, a third terminal coupled to the output node, and a fourth terminal coupled to a second supply voltage;
    a third transistor of the second device type having a third control terminal coupled to the output node, a fifth terminal coupled to the output node, and a sixth terminal coupled to the first supply voltage, wherein the third transistor is sized to provide a current that compensates for a second leakage current in the second transistor when the input voltage node is at a first voltage; and a fourth transistor of the first device type having a fourth control terminal coupled to the output node, a seventh terminal coupled to the output node, and an eighth terminal coupled to the second supply voltage, wherein the fourth transistor is sized to provide a current that compensates for a first leakage current in the first transistor when the input voltage node is at a first voltage.

13. The circuit of claim 12, wherein the first, second, third, and fourth transistors each comprise a metal oxide semiconductor field effect transistors (MOSFET), each MOSFET having a gate, a drain, and a source, wherein the gate of each MOSFET is the control terminal.

14. The circuit of claim 13, wherein the first and second MOSFETs are operated in a sub-threshold regime.

15. The circuit of claim 13, wherein the first transistor and the fourth transistor comprise p-type MOSFETs and the second transistor and the third transistor comprise n-type MOSFETs.

16. The circuit of claim 12, wherein:
the third transistor is implemented as a plurality of n NMOS transistors, wherein the plurality of n NMOS transistors are the same size as the second transistor and the plurality is sized by selecting the number of transistors n; and
the fourth transistor is implemented as a plurality of p PMOS transistors, wherein the plurality of p PMOS transistors are the same size as the first transistor and the plurality is sized by selecting p.

17. A circuit comprising:
a first transistor of a first device type having a first control terminal coupled to an input voltage node, a first terminal coupled to an output node, and a second terminal coupled to a first supply voltage;
a second transistor of a second device type opposite the first device type having a second control terminal coupled to the input voltage node, a third terminal coupled to the output node, and a fourth terminal coupled to a second supply voltage;
a third transistor of the second device type having a third control terminal coupled to the output node, a fifth terminal coupled to the output node, and a sixth terminal coupled to the first supply voltage;
a fourth transistor of the first device type having a fourth control terminal coupled to the output node, a seventh terminal coupled to the output node, and an eighth terminal coupled to the second supply voltage; and
wherein the first transistor has a first body contact coupled to the first supply voltage, the second transistor has a second body contact coupled to the second supply voltage, the third transistor has a third body contact coupled to the second supply voltage, and the fourth transistor has a fourth body contact coupled to the first supply voltage.

18. A circuit comprising:
a first transistor of a first device type having a first control terminal coupled to an input voltage node, a first terminal coupled to an output node, and a second terminal coupled to a first supply voltage;
a second transistor of a second device type opposite the first device type having a second control terminal coupled to the input voltage node, a third terminal coupled to the output node, and a fourth terminal coupled to a second supply voltage;
a third transistor of the second device type having a third control terminal coupled to the output node, a fifth terminal coupled to the output node, and a sixth terminal coupled to the first supply voltage;
a fourth transistor of the first device type having a fourth control terminal coupled to the output node, a seventh terminal coupled to the output node, and an eighth terminal coupled to the second supply voltage; and
wherein the first transistor has a first body contact coupled to the first supply voltage, the second transistor has a second body contact coupled to the second supply voltage, the third transistor has a third body contact coupled to the output node, and the fourth transistor has a fourth body contact coupled to the output node.

* * * * *